(12) United States Patent
Taguchi

(10) Patent No.: US 10,804,118 B2
(45) Date of Patent: Oct. 13, 2020

(54) RESIN ENCAPSULATING MOLD AND METHOD OF MANUFACTURING SEMICONDUCTOR DEVICE

(71) Applicant: ABLIC Inc., Chiba-shi, Chiba (JP)

(72) Inventor: Yasuhiro Taguchi, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 16/183,989

(22) Filed: Nov. 8, 2018

(65) Prior Publication Data

US 2019/0148173 A1 May 16, 2019

(30) Foreign Application Priority Data

Nov. 10, 2017 (JP) .................... 2017-217347

(51) Int. Cl.
*H01L 21/56* (2006.01)
*H01L 23/495* (2006.01)
*H01L 23/00* (2006.01)
*H01L 23/31* (2006.01)

(52) U.S. Cl.
CPC ........ *H01L 21/565* (2013.01); *H01L 23/4951* (2013.01); *H01L 23/49551* (2013.01); *H01L 23/49555* (2013.01); *H01L 23/3107* (2013.01); *H01L 23/49513* (2013.01); *H01L 24/32* (2013.01); *H01L 24/48* (2013.01); *H01L 24/49* (2013.01); *H01L 24/73* (2013.01); *H01L 24/92* (2013.01); *H01L 2224/32245* (2013.01); *H01L 2224/48091* (2013.01); *H01L 2224/48247* (2013.01); *H01L 2224/49171* (2013.01); *H01L 2224/73265* (2013.01); *H01L 2224/92247* (2013.01)

(58) Field of Classification Search
CPC .................................................... H01L 21/565
See application file for complete search history.

(56) References Cited

U.S. PATENT DOCUMENTS

2008/0224280 A1 9/2008 Kimura
2016/0343644 A1* 11/2016 Kawashima ...... H01L 23/49537

FOREIGN PATENT DOCUMENTS

JP 2008-227280 A 9/2008

* cited by examiner

*Primary Examiner* — Seahvosh Nikmanesh
(74) *Attorney, Agent, or Firm* — Brinks Gilson & Lione

(57) ABSTRACT

A die pad is set down at a height lower than a height at which inner leads are provided and a level difference for the set-down becomes larger than a depth of a lower-mold cavity formed in a lower mold. The die pad is placed so that a back surface of the die pad is brought into contact with a lower-mold cavity bottom surface. The lead frame is clamped between the lower mold and an upper mold which has an upper-mold cavity and a suspension-lead relief groove formed to communicate with an end of an opening of the upper-mold cavity to achieve resin encapsulation.

7 Claims, 9 Drawing Sheets

RESIN ENCAPSULATING MOLD AND METHOD OF MANUFACTURING SEMICONDUCTOR DEVICE

RELATED APPLICATIONS

This application claims priority under 35 U.S.C. § 119 to Japanese Patent Application No. 2017-217347 filed on Nov. 10, 2017, the entire content of which is hereby incorporated by reference.

BACKGROUND OF THE INVENTION

1. Field of the Invention

The present invention relates to a resin encapsulating mold and a method of manufacturing a semiconductor device.

2. Description of the Related Art

A semiconductor package that requires a heat dissipation property as represented by the power semiconductor device generally has the following structure. Specifically, the back surface of the die pad on which a semiconductor chip is placed is exposed from a resin to serve as a heat dissipation plate. At the time of mounting onto a circuit board, the heat dissipation plate is bonded to the circuit board by solder so as to dissipate heat to the circuit board.

FIG. 10A and FIG. 10B are sectional views in which a lead frame is placed in a related-art resin encapsulating mold, FIG. 10A is a sectional view, and FIG. 10B is an enlarged sectional view of cavities and a periphery thereof. In FIG. 10A and FIG. 10B, a lead frame 9 is clamped between a lower mold 21 and an upper mold 22. An upper-mold cavity 22a is formed in the upper mold 22, whereas a lower-mold cavity 21a is formed in the lower mold 21 so as to oppose the upper-mold cavity 22a. In the lower-mold cavity 21a, a die pad 4 which is set down by suspension leads 2 is provided. The die pad 4 is placed so that a back surface of the die pad 4 is held in contact with an upper surface of the lower mold 21. At this time, since a bending depth of the die pad 4 that is set down is set slightly larger than a depth of the lower-mold cavity 21a in consideration of a manufacturing variation, stress is applied to the die pad 4 so that the vicinity of a center of the back surface of the die pad 4 is uplifted to generate a gap S2 when the lead frame 9 is clamped between the lower mold 21 and the upper mold 22. When a sealing resin flows into the lower-mold cavity 21a and the upper-mold cavity 22a in this state, the sealing resin flows into the gap S2 generated by the uplift of the back surface of the die pad 4 to undesirably generate a resin burr. The thus generated resin burr hinders the heat dissipation from the back surface of the die pad 4 to significantly lower reliability as a semiconductor device.

In order to solve the above-mentioned problem, several related-art devices and technologies have been proposed. For example, in Japanese Patent Application Laid-open No. 2008-227280, there is disclosed a technology of providing the suspension pin with a branch portion.

To form the branch portion described in Japanese Patent Application Laid-open No. 2008-227280, however, additional working using a press punch and a die is required after press working with a common stamping die. The additional working is performed for a small area, and hence warp and undulation of the lead frame itself are liable to occur, making the shape of the lead frame unstable. Further, since the press punch and the die which are used for the small area are liable to degrade, regular polishing or replacement is required.

SUMMARY OF THE INVENTION

The present invention has an object to provide a resin encapsulating mold and a method of manufacturing a semiconductor device which enable prevention of generation of a resin burr even when a lead frame without complicated additional working is used.

The present invention uses the following measures.

According to one embodiment of the present invention, there is provided a resin encapsulating mold for a semiconductor device in which a surface of a die pad opposite to a semiconductor-chip mounted surface of the die pad is exposed from a resin encapsulating body. The resin encapsulating mold includes: a lower mold having a lower-mold cavity; and an upper mold having a first upper-mold cavity and a second upper-mold cavity, the first upper-mold cavity opposing the lower-mold cavity and having an opening, and the second upper-mold cavity communicating with an end of the opening of the first upper-mold cavity.

According to another embodiment of the present invention, there is provided a method of manufacturing a semiconductor device including: preparing a lead frame including a die pad, a plurality of suspension leads configured to support the die pad, inner leads arranged in a vicinity of the die pad so as to separate away from each other, and outer leads provided so as to extend from the respective inner leads; processing the lead frame to bend the plurality of suspension leads so that the die pad is set down below a height at which the inner leads are provided and a bending depth of the die pad that is set down becomes larger than a depth of a lower-mold cavity formed in a lower mold; mounting a semiconductor chip onto the die pad; electrically connecting the semiconductor chip and the inner leads to each other; bringing a surface of the die pad opposite to a semiconductor-chip mounted surface of the die pad into contact with a bottom surface of the lower-mold cavity; clamping the lead frame between the lower mold and an upper mold having a first upper-mold cavity which forms a pair with the lower-mold cavity, and deforming a portion of each of the plurality of suspension leads so that the deformed portions of the plurality of suspension leads are contained in the first upper-mold cavity and second upper-mold cavities formed so as to communicate with opening ends of the first upper-mold cavity; and injecting a sealing resin into the lower-mold cavity, the first upper-mold cavity, and the second upper-mold cavities to achieve resin encapsulation.

Through use of the above-mentioned measures, the semiconductor device with a high heat dissipation property without generation of a resin burr having a small thickness can be provided.

DETAILED DESCRIPTION OF THE PREFERRED EMBODIMENTS

Embodiments for carrying out the present invention are now described with reference to the accompanying drawings.

Figure 1A:
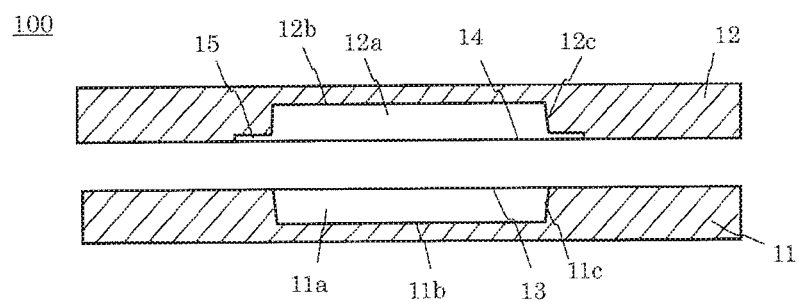
FIG. 1A and FIG. 1B are sectional views of a resin encapsulating mold according to a first embodiment of the present invention.
Figure 1B:
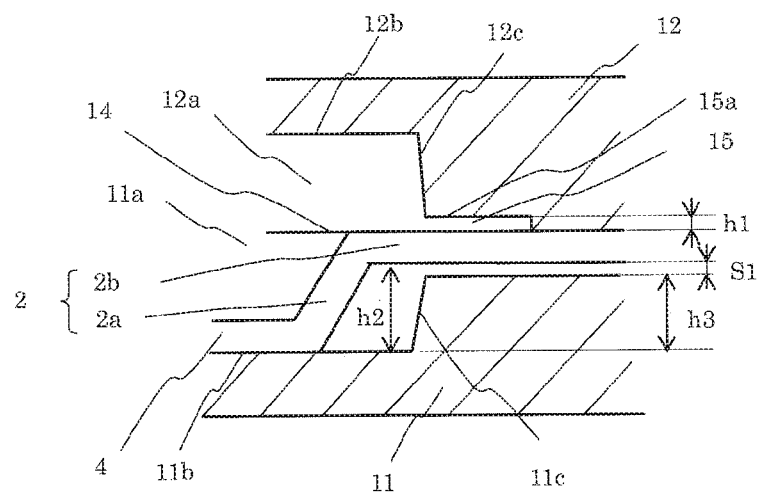

FIG. 1A and FIG. 1B are sectional views of a resin encapsulating mold according to the first embodiment of the present invention. FIG. 1A is a sectional view of an upper mold and a lower mold. FIG. 1B is an enlarged view of ends of cavities As illustrated in FIG. 1A, a mold 100 includes a lower mold 11 and an upper mold 12 which form a pair. A lower-mold cavity 11a having a recessed shape is engraved in the lower mold 11. Lower-mold cavity side surfaces 11c, each being an outer peripheral side surface of the lower-mold cavity 11a, are tapered gradually from a lower-mold opening surface 13. An upper-mold cavity 12a having a recessed shape is engraved in the upper mold 12. Upper-mold cavity side surfaces 12c, each being an outer peripheral side surface of the upper-mold cavity 12a, are tapered gradually from an upper-mold opening surface 14. The lower-mold cavity side surfaces 11c and the upper-mold cavity side surfaces 12c are tapered so as to facilitate demolding of a resin encapsulating body after molding from the mold 100.

Further, the lower-mold cavity 11a and the upper-mold cavity 12a are designed so that the lower-mold opening surface 13 substantially faces the upper-mold opening surface 14. Suspension-lead relief grooves 15, each being a cavity having a smaller capacity than the capacity of the upper-mold cavity 12a, are formed in the upper mold 12 so as to communicate with ends of the upper-mold opening surface 14 that defines an opening end of the upper-mold cavity 12a. The suspension-lead relief grooves 15 are formed so as to relieve stress applied to a die pad when a lead frame 9 is clamped between the lower mold 11 and the upper mold 12.

FIG. 1B is an enlarged view of ends of the cavities, and is an illustration in which the lead frame 9 is placed on the lower mold 11 and the upper mold 12 is held in contact with the lead frame 9. A die pad 4 is placed on a lower-mold cavity bottom surface 11b of the lower-mold cavity 11a formed in the lower mold 11 so that a back surface of the die pad 4 on a side opposite to a mounting surface of the die pad 4, on which a semiconductor chip is to be placed, is held in contact with the lower-mold cavity bottom surface 11b.

A suspension lead 2 is provided to an end of the die pad 4, thereby supporting the die pad 4. The suspension lead 2 includes a suspension-lead inclined portion 2a and a suspension-lead horizontal portion 2b. The suspension-lead inclined portion 2a is configured to set down the die pad 4. The suspension-lead relief groove 15 is formed above the suspension-lead horizontal portion 2b so as to oppose the suspension-lead horizontal portion 2b. The suspension-lead horizontal portion 2b includes a portion opposed to the suspension-lead relief groove 15 and a portion that is held in direct contact with the upper mold 12. When the lead frame 9 is clamped between the lower mold 11 and the upper mold 12, the portion of the suspension-lead horizontal portion 2b which is held in direct contact with a lower surface of the upper mold 12 is practically clamped between the lower surface of the upper mold 12 and an upper surface of the lower mold 11.

On a sectional view, the suspension-lead relief groove 15 is defined by a relief-groove upper surface 15a on an upper side and by the upper-mold opening surface 14 on a lower side. An end of the suspension-lead relief groove 15 is open toward the upper-mold cavity 12a, whereas the other end thereof is defined by the upper mold 12. The relief-groove upper surface 15a of the suspension-lead relief groove 15 is formed in parallel to the upper-mold opening surface 14 of the upper mold 12. A groove depth h1 which is a distance between the relief-groove upper surface 15a and the upper-mold opening surface 14 is equal to or larger than a difference S1 between a bending depth h2 of the die pad 4 that is set down and a depth h3 of the lower-mold cavity 11a. The suspension-lead relief groove 15 is formed so that the groove depth h1 becomes smaller than a depth of the upper cavity 12a which is defined by a distance between the upper-mold opening surface 14 and an upper-mold cavity upper surface 12b. With the structure described above, a resin that is injected to fill the suspension-lead relief grooves 15 at the time of resin encapsulation can be easily removed afterward.

Figure 2:
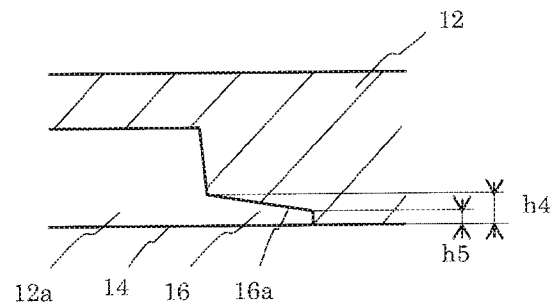
FIG. 2 is a sectional view of a resin encapsulating mold according to a second embodiment of the present invention.

FIG. 2 is a sectional view of a resin encapsulating mold according to a second embodiment of the present invention. A difference from FIG. 1B lies in that a relief-groove upper surface 16a of a suspension-lead relief groove 16 is formed as a tapered upper surface (inclined surface) instead of being parallel to the upper-mold opening surface 14. The tapered upper surface has a shape extending along a shape of the suspension-lead horizontal portion 2b that is deformed when the suspension lead 2 is clamped. The tapered upper surface is formed so that a groove depth h4 of the suspension-lead relief groove 16 on the upper-mold cavity 12a side becomes larger than a groove depth h5 of the suspension-lead relief groove 16 on a side opposite to the upper-mold cavity 12a. In this case, the suspension-lead relief groove 16 is formed so that the groove depth h4 is the same as the groove depth h1 in the first embodiment and the groove depth h5 is smaller than the groove depth h1.

Figure 3:
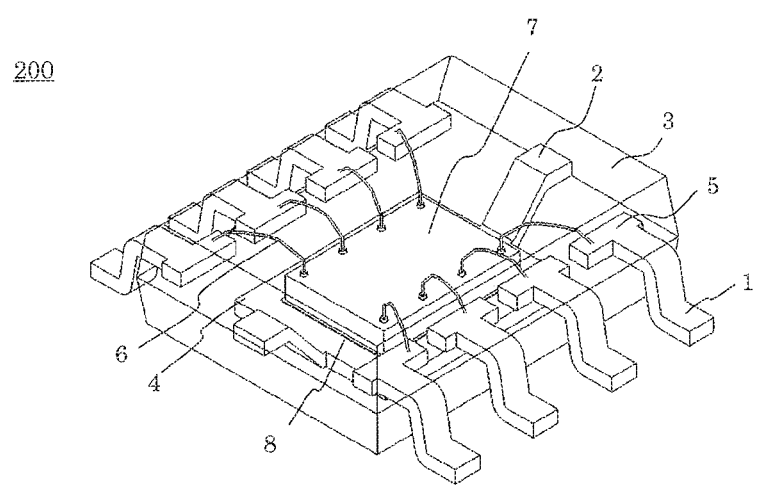
FIG. 3 is a perspective view of a semiconductor device manufactured with the resin encapsulating mold according to an embodiment of the present invention.

FIG. 3 is a perspective view of a semiconductor device manufactured with the resin encapsulating mold according an embodiment of the present invention. A semiconductor device 200 illustrated in FIG. 3 includes a semiconductor chip 7 bonded onto the die pad 4 through a die attach agent 8. A plurality of inner leads 5 are arranged in the vicinity of the die pad 4. Outer leads 1 are provided so as to extend from the respective inner leads 5. The inner leads 5 and a plurality of electrode pads (not shown) provided on the semiconductor chip 7 are electrically connected through wires 6. The above-mentioned components are covered with a sealing resin 3. The back surface of the die pad 4, which is on the side opposite to the mounting surface of the die pad 4 on which the semiconductor chip 7 is mounted, is exposed in the center of a bottom surface of the sealing resin 3. A plurality of suspension leads 2 are provided in connection to both ends of the die pad 4. The suspension leads 2 are bent so that the die pad 4 is set down with respect to the inner leads 5.

Figure 4A:
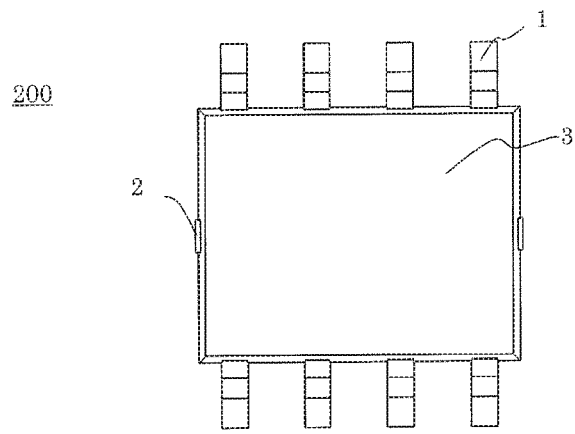
FIG. 4A is a top view.
Figure 4B:
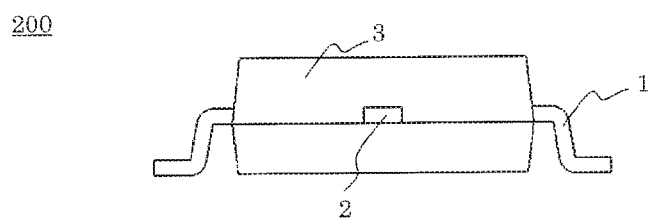
FIG. 4B is a side view.
Figure 4C:
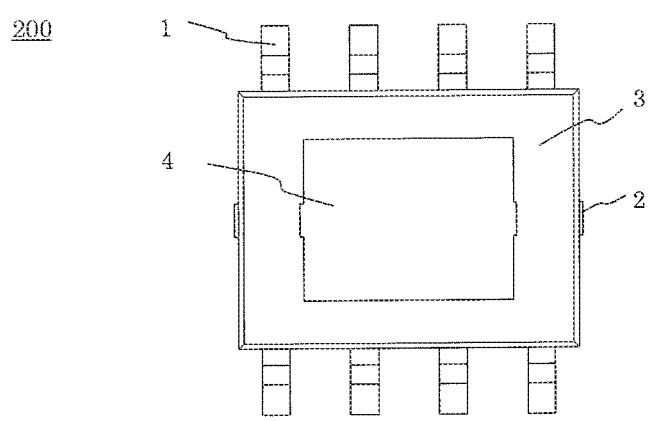
FIG. 4C is a back view of the semiconductor device manufactured with the resin encapsulating mold according to an embodiment of the present invention.

FIG. 4A, FIG. 4B, and FIG. 4C are outline views for illustrating a resin-encapsulated semiconductor device according to an embodiment of the present invention. FIG. 4A is a top view in which the plurality of outer leads 1 are provided to each of two opposed side surfaces of the sealing resin 3 having a rectangular shape and ends of the suspension leads 2 are exposed on other two side surfaces which are orthogonal to the side surfaces to which the outer leads 1 are provided. FIG. 4B is a side view as viewed from the surface on which the suspension lead 2 is exposed. In FIG. 4B, the outer leads 1 projecting substantially from the middle of a height of the sealing resin 3 are bent and extended downward to reach a level of the bottom surface of the sealing resin 3. The height at which the suspension leads 2 project from the sealing resin 3 is the same as the height at which the outer leads 1 project therefrom. FIG. 4C is a back view in which the back surface of the die pad 4 is exposed from a back surface of the sealing resin 3 to achieve the resin-encapsulated semiconductor device 200 having a high heat dissipation property. The resin-encapsulated semiconductor device 200 is encapsulated in a package having a shape generally referred to as "gull wing".

Figure 5A:
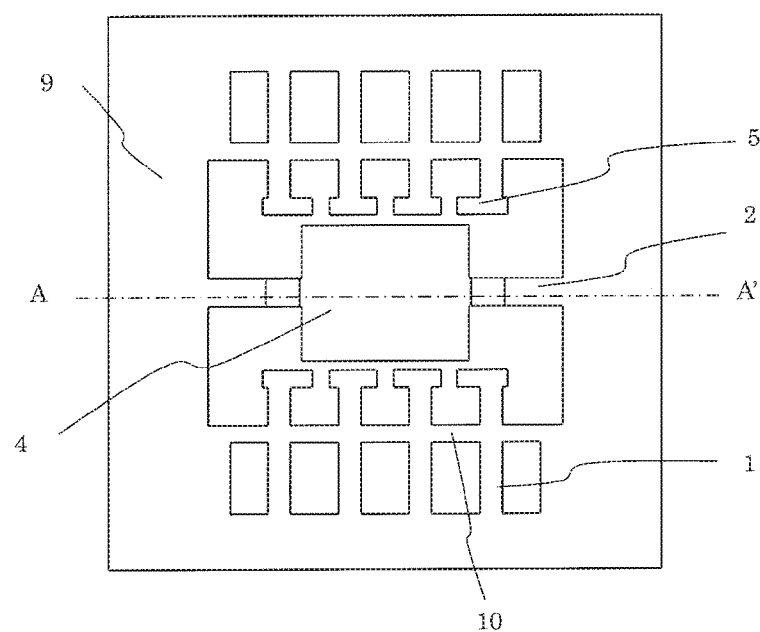
FIG. 5A and FIG. 5B are explanatory views of a method of manufacturing a semiconductor device which uses the resin encapsulating mold according to an embodiment of the present invention.

FIG. 5A to FIG. 9C are explanatory views of a method of manufacturing a semiconductor device using the resin encapsulating mold according to an embodiment of the present invention. First, the lead frame 9 which is illustrated in FIG. 5A and FIG. 5B is prepared. FIG. 5A is a top view, and FIG. 5B is a sectional view taken along the line A-A' of FIG. 5A. The lead frame 9 includes the die pad 4, the suspension leads 2, the inner leads 5, the outer leads 1, and dam bars 10. On the die pad 4, the semiconductor chip 7 is placed. The suspension leads 2 are provided to couple the die pad 4 to a peripheral portion of the lead frame 9. The inner leads 5 are provided in the periphery of the die pad 4 so as to separate away from each other. The outer leads 1 are provided so as to extend from the respective inner leads 5. The dam bars 10 are provided between the outer leads 1 so as to couple the outer leads 1 adjacent to each other. The dam bars 10 have a function of preventing the sealing resin 3 from flowing toward the outer leads 1.

Figure 5B:
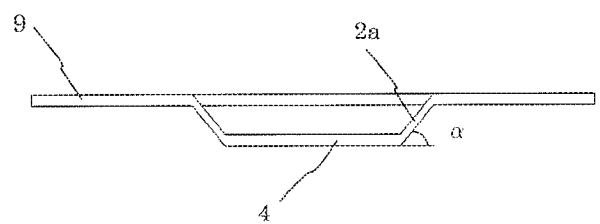

As illustrated in FIG. 5B, a sectional view of FIG. 5A, by bending the suspension leads 2 downward, the die pad 4 is provided at a position lower than the inner leads 5 and the peripheral portion of the lead frame 9. In this case, in order to reliably expose the die pad 4 from the back surface of the sealing resin 3, the suspension leads 2 are bent so that the bending depth h2 of the die pad 4 becomes larger than the depth h3 of the lower-mold cavity 11a. An inclination angle α of the suspension-lead inclined portion 2a is only required to fall within a range of 60 degrees to 120 degrees. The inclination angle α is generally set to about 45 degrees. With the inclination angle α being set to fall within the range of 60 degrees to 120 degrees, the stress applied to the die pad 4 at the time of clamping can be relieved. Thus, in combination with the resin encapsulating mold according to an embodiment of the present invention, the inclination angle α falling within the range of 60 degrees to 120 degrees effectively works to prevent the generation of a resin burr on the back surface of the die pad 4.

When the inclination angle is set larger than 90 degrees, the above-mentioned effect is enhanced. On the other hand, in consideration of possibility of transport of the lead frames 9 in a stacked manner or elimination of interleaving paper for prevention of deformation during manufacturing steps, it is desirable that the inclination angle α be set to fall within a range of 60 degrees to 80 degrees. The lead frame 9 which has already been bent has been described above. In practice, first through a step of preparing the lead frame 9 having a flat plate shape including the die pad 4, the inner leads 5, the outer leads 1, the suspension leads 2, and the dam bars 10 and then through a step of performing predetermined bending on the lead frame 9, the lead frame 9 illustrated in FIG. 5A and FIG. 5B is prepared.

Figure 6A:
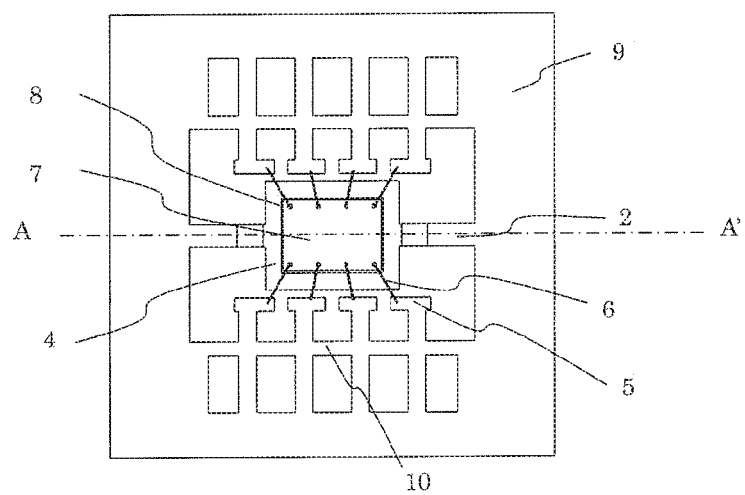
FIG. 6A and FIG. 6B are explanatory views of the method of manufacturing a semiconductor device which uses the resin encapsulating mold according to an embodiment of the present invention, subsequent to FIG. 5A and FIG. 5B.
Figure 6B:
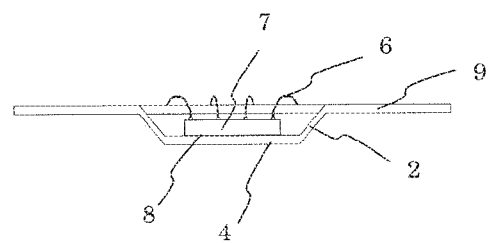

FIG. 6A and FIG. 6B are explanatory views of the method of manufacturing a semiconductor device which uses the resin encapsulating mold according to an embodiment of the present invention subsequent to FIG. 5A and FIG. 5B. Similarly to FIG. 5A and FIG. 5B, FIG. 6A is a top view, and FIG. 6B is a sectional view taken along the line A-A' of FIG. 6A. The semiconductor chip 7 is bonded onto the die pad 4 through the die attach agent 8. The inner leads 5 and the electrode pads provided to the surface of the semiconductor chip 7 are electrically connected through the wires 6. The connection between the inner leads 5 and the electrode pads provided to the surface of the semiconductor chip 7 is not limited to the connection through the wires 6 and may be other electrical connections. The inner leads 5 and the die pad 4 are not located on the same plane. A surface height of the semiconductor device 7 placed on the die pad 4 that is set down is lower than a surface height of the inner leads 5.

Figure 7A:
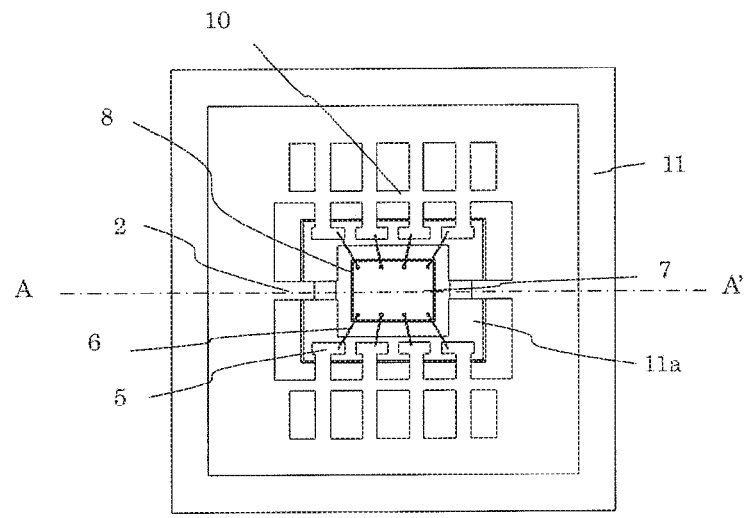
FIG. 7A, FIG. 7B, and FIG. 7C are explanatory views of the method of manufacturing a semiconductor device which uses the resin encapsulating mold according to an embodiment of the present invention, subsequent to FIG. 6A and FIG. 6B.
Figure 7B:
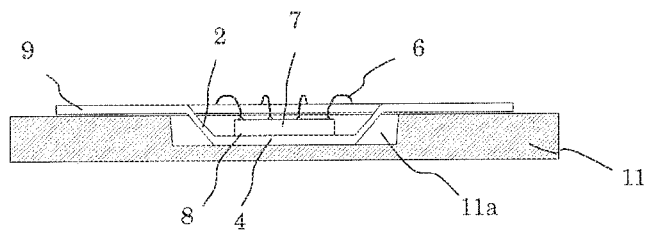
Figure 7C:
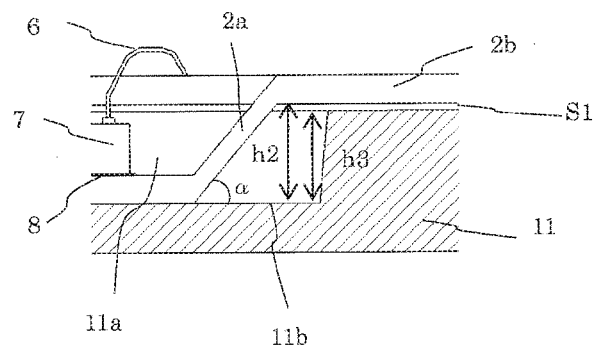

FIG. 7A, FIG. 7B, and FIG. 7C are explanatory views of the method of manufacturing a semiconductor device which uses the resin encapsulating mold according to an embodiment of the present invention subsequent to FIG. 6A and FIG. 6B. FIG. 7A, FIG. 7B, and FIG. 7C are illustrations in which the lead frame 9 is placed on the lower mold 11. FIG. 7A is a top view, FIG. 7B is a sectional view taken along the line A-A' of FIG. 7A, and FIG. 7C is a partially enlarged view of FIG. 7B. The die pad 4 arranged in the center of the lead frame 9 is accommodated in the lower-mold cavity 11a and is placed so that the back surface of the die pad 4 is held in contact with the lower-mold cavity bottom surface 11b. Since the bending depth h2 of the die pad 4 is larger than the depth h3 of the lower-mold cavity 11a, a gap S1 appears between a back surface of the lead frame 9 and the upper surface of the lower mold 11, when the back surface of the die pad 4 is brought into contact with the lower-mold cavity 11a. The inclination angle of the suspension-lead inclined portion 2a at this time remains equal to the inclination angle α at the time of bending of the lead frame 9.

Figure 8A:
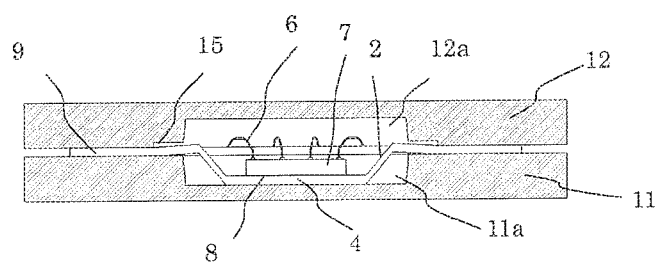
FIG. 8A and FIG. 8B are explanatory views of the method of manufacturing a semiconductor device which uses the resin encapsulating mold according to an embodiment of the present invention, subsequent to FIG. 7A, FIG. 7B, and FIG. 7C.
Figure 8B:
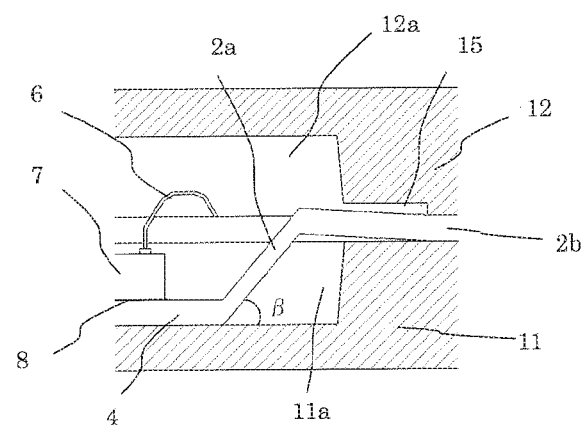

FIG. 8A and FIG. 8B are explanatory views of the method of manufacturing a semiconductor device which uses the resin encapsulating mold according to an embodiment of the present invention subsequent to FIG. 7A, FIG. 7B, and FIG. 7C. FIG. 8A and FIG. 8B are illustrations in which the lead frame 9 is clamped between the lower mold 11 and the upper mold 12. FIG. 8A is a sectional view, and FIG. 8B is a partially enlarged view of FIG. 8A.

Through clamping of the lead frame 9 between the lower mold 11 and the upper mold 12, the gap S1 between the back surface of the lead frame 9 and the upper surface of the lower mold 11 which is illustrated in FIG. 7C vanishes. Through the clamping, the die pad 4 is firmly fixed onto the lower-mold cavity bottom surface 11b. At the same time, the suspension leads 2 which are provided in connection to the die pad 4 are deformed upward so as to project into the upper-mold cavity 12a and the suspension-lead relief grooves 15. Further, when the inclination angle α before the clamping is larger than 90 degrees, an inclination angle β after the clamping becomes slightly smaller than the inclination angle α before the clamping. An intersection between the suspension-lead inclined portion 2a and the suspension-lead horizontal portion 2b becomes a summit of the deformation and is contained in the upper-mold cavity 12a. A gently tapered portion of the suspension-lead horizontal portion 2b which is continuous from the corner is contained in the suspension-lead relief groove 15. The inclination angle α before the clamping is set larger than 50 degrees so as to easily deform the suspension-lead horizontal portion 2b with the stress applied to the lead frame 9 when the upper mold 12 is moved down from above to clamp the lead frame 9.

The groove depth h1 of the suspension-lead relief groove 15 is designed so as to prevent the deformed suspension-lead horizontal portion 2b from coming into contact with the upper mold 12. In this manner, the groove depth h1 becomes equal to or larger than the difference S1 between the bending depth h2 of the die pad 4 that is set down and the depth h3 of the lower-mold cavity 11a, as described above.

In FIG. 8A and FIG. 8B, the suspension-lead relief groove 15 in the first embodiment is illustrated as an example. Through use of the suspension-lead relief groove 16 having the tapered upper surface in the second embodiment as illustrated in FIG. 2, the suspension-lead relief groove 16 has the shape extending along the shape of the deformed suspension lead 2b, and hence the suspension-lead relief groove 16 having a reduced excess air gap can be achieved.

As described above, through use of the resin encapsulating mold according to an embodiment of the present invention, the gap S1 is eliminated by clamping the suspension-lead horizontal portion 2b between the lower mold 11 and the upper mold 12. Instead, the suspension lead 2 is deformed to absorb the stress generated at the time of clamping. Thus, an excessive stress is not applied to the die pad 4, and hence the deformation of the die pad 4 can be prevented. As a result, a gap does not appear between the lower-mold cavity bottom surface 11b and the back surface of the die pad 4. Further, peeling of the semiconductor chip 7 at a die-bonding interface and warpage of the semiconductor chip 7 by itself which are suspected to occur due to the deformation of the die pad 4 can be prevented. Thus, a problem in reliability of the semiconductor device and other problems, for example, a characteristic shift of the semiconductor device, can be prevented.

Figure 9A:
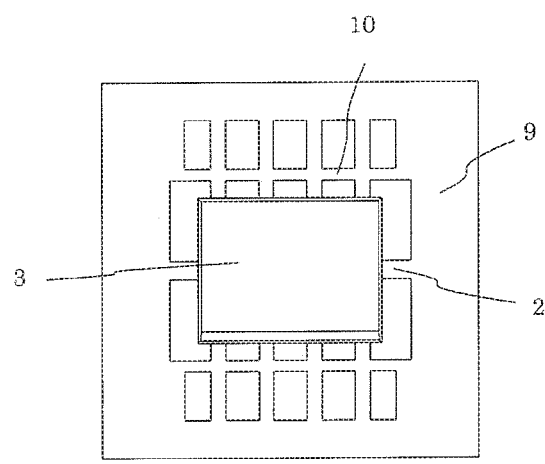
FIG. 9A, FIG. 9B, and FIG. 9C are explanatory views of the method of manufacturing a semiconductor device which uses the resin encapsulating mold according to an embodiment of the present invention, subsequent to FIG. 8A and FIG. 8B.
Figure 9B:
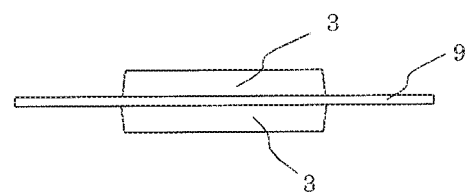
Figure 9C:
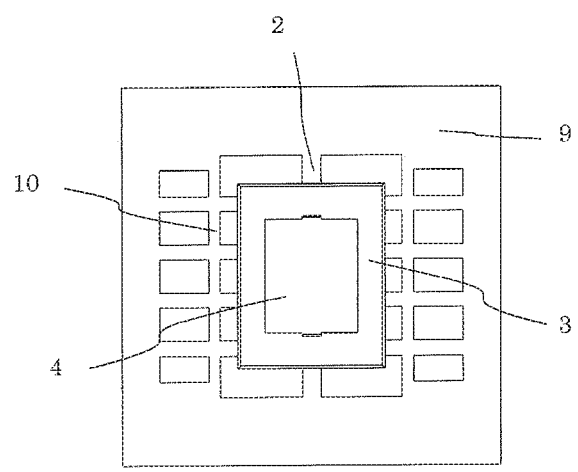

Subsequently, under the above-mentioned state, the sealing resin 3 is injected into the lower-mold cavity 11a and the upper-mold cavity 12a. FIG. 9A, FIG. 9B, and FIG. 9C are explanatory views of the method of manufacturing a semiconductor device which uses the resin encapsulating mold according to an embodiment of the present invention subsequent to FIG. 8A and FIG. 8B. FIG. 9A, FIG. 9B, and FIG. 9C are views after the sealing resin 3 is injected into the lower-mold cavity 11a and the upper-mold cavity 12a to mold the components and a surplus resin on the suspension leads 2 is removed from the resin encapsulating body demolded from the mold. The peripheral portion of the lead frame 9 is not separated. FIG. 9A is a top view, FIG. 9B is a side view, and FIG. 9C is a back view. As illustrated in FIG. 9C which is the back view a resin burr is not present on the back surface of the die pad 4. This is because the resin encapsulation is achieved under a state in which the back surface of the die pad 4 and the lower-mold cavity bottom surface 11b are held in close contact with each other without a gap therebetween.

Figure 10A:
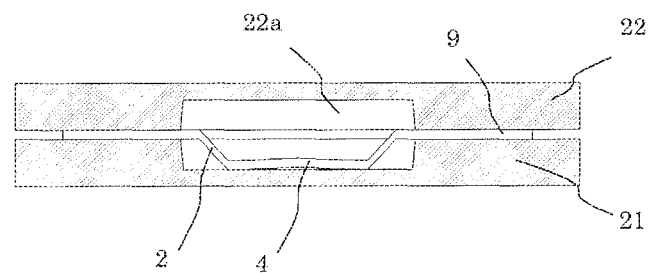
FIG. 10A and FIG. 10B are sectional views of a state in which a lead frame is placed in a related-art resin encapsulating mold.
Figure 10B:
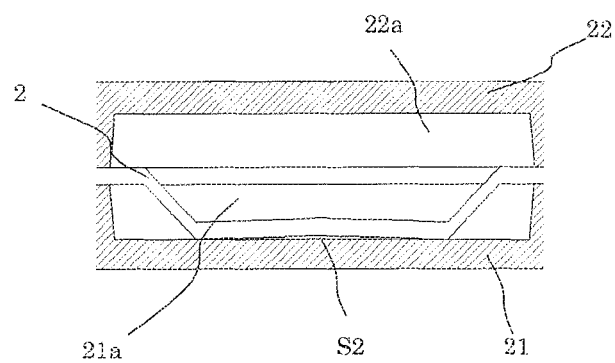

When a related-art resin encapsulating mold as illustrated in FIG. 10A and FIG. 10B is used, stress is applied to the die pad 4 when the lead frame 9 is clamped between the upper mold 22 and the lower mold 21. As a result, the center of the back surface of the die pad 4 is uplifted. The sealing resin 3 undesirably flows into a gap S2 generated by the uplift to generate a resin burr having a small thickness which hinders heat dissipation from the back surface of the die pad 4. Through use of the resin encapsulating mold according to an embodiment of the present invention, the center of the back surface of the die pad 4 is not uplifted, thereby preventing the generation of the gap below the back surface of the die pad 4. Thus, the resin-encapsulated semiconductor device having a high heat dissipation property can be formed.

What is claimed is:

1. A resin encapsulating mold for a semiconductor device in which a surface of a die pad opposite to a semiconductor-chip mounted surface of the die pad is exposed from a resin encapsulating body, the resin encapsulating mold comprising:
    a lower mold having a lower-mold cavity, the lower-mold cavity configured to receive the die pad such that the surface of the die pad opposite to the semiconductor-chip mounted surface of the die pad is exposed to a lower surface of the lower-mold cavity; and
    an upper mold having a first upper-mold cavity and a second upper-mold cavity, the first upper-mold cavity opposing the lower-mold cavity and having an opening, and the second upper-mold cavity communicating with an end of the opening of the first upper-mold cavity.

2. The resin encapsulating mold according to claim 1, wherein a depth of the second upper-mold cavity is smaller than a depth of the first upper-mold cavity.

3. The resin encapsulating mold according to claim 2, wherein the depth of the second upper-mold cavity is equal to or larger than a difference between a bending depth of the die pad that is set down and a depth of the lower-mold cavity.

4. The resin encapsulating mold according to claim 1, wherein the second upper-mold cavity opposes a top surface of the lower mold surrounding and defining, in part, the lower-mold cavity.

5. The resin encapsulating mold according to claim 1, wherein the upper mold further comprises a bottom surface surrounding and defining, in part, the second upper-mold cavity, the bottom surface of the upper mold opposing a top surface of the lower mold.

6. The resin encapsulating mold according to claim 5, wherein the bottom surface of the upper mold and the top surface of the lower mold opposite to the bottom surface of the upper mold are configured to clamp suspension leads therebetween, the suspension leads being connected to the die pad.

7. The resin encapsulating mold according to claim 6, wherein the second upper-mold cavity is configured to accommodate portions of the suspension leads that deform upward to project into the second upper-mold cavity when the suspension leads are clamped between the top surface of the lower mold and the bottom surface of the upper mold.

\* \* \* \* \*